United States Patent
Phillips

(10) Patent No.: US 10,359,454 B2
(45) Date of Patent: Jul. 23, 2019

(54) METHOD FOR ACCURATELY DETERMINING POWER USAGE IN A TWO PHASE CIRCUIT HAVING BOTH TWO PHASE AND SINGLE PHASE LOADS

(71) Applicant: Schneider Electric USA, Inc., Andover, MA (US)

(72) Inventor: Timothy Brian Phillips, Murfreesboro, TN (US)

(73) Assignee: Schneider Electric USA, Inc., Andover, MA (US)

( * ) Notice: Subject to any disclaimer, the term of this patent is extended or adjusted under 35 U.S.C. 154(b) by 306 days.

(21) Appl. No.: 15/284,058

(22) Filed: Oct. 3, 2016

(65) Prior Publication Data

US 2018/0095118 A1 Apr. 5, 2018

(51) Int. Cl.
  *G01R 15/18* (2006.01)
  *G01R 21/133* (2006.01)
  *H02J 3/14* (2006.01)
  *G01R 31/42* (2006.01)
  *G05B 15/02* (2006.01)

(52) U.S. Cl.
  CPC ............ *G01R 21/133* (2013.01); *G01R 15/18* (2013.01); *G01R 31/42* (2013.01); *G05B 15/02* (2013.01); *H02J 3/14* (2013.01); *H02J 2003/143* (2013.01); *Y04S 20/242* (2013.01)

(58) Field of Classification Search
  None
  See application file for complete search history.

(56) References Cited

U.S. PATENT DOCUMENTS

| | | | | |
|---|---|---|---|---|
| 2006/0238932 | A1* | 10/2006 | Westbrock, Jr. | H02H 1/0038 361/42 |
| 2011/0074382 | A1* | 3/2011 | Patel | G01R 15/207 324/76.11 |
| 2014/0184198 | A1* | 7/2014 | Cook | G01R 21/133 324/107 |
| 2016/0349311 | A1* | 12/2016 | Hayashi | G01R 31/2829 |

\* cited by examiner

*Primary Examiner* — Gregory J Toatley, Jr.
*Assistant Examiner* — Terence E Stifter, Jr.
(74) *Attorney, Agent, or Firm* — Locke Lord LLP

(57) ABSTRACT

The present invention provides a method for accurately determining the power usage on an unbalanced two phase electrical circuit having both two phase and single phase loads using a single current transformer (CT). The method includes a learning algorithm stored in a memory of a monitoring device, the algorithm configured to be implemented by a processor. The learning algorithm determines whether the CT is monitoring the conductor that supplies the single phase load and alerting the installer if it is not monitoring the conductor supplying the single phase load. Upon determining that the CT is monitoring the conductor that supplies the single phase load the learning algorithm will learn the characteristics of at least the single phase load and store the learned characteristic in a memory associated of the monitoring device. The monitoring device also includes a run algorithm that accurately determines the power usage of the two phase circuit by monitoring and recording the current drawn by loads on the monitored conductor and calculating, from the monitored current and the learned characteristics of the single phase load, the power consumed by the unbalanced two phase circuit.

24 Claims, 6 Drawing Sheets

METHOD FOR ACCURATELY DETERMINING POWER USAGE IN A TWO PHASE CIRCUIT HAVING BOTH TWO PHASE AND SINGLE PHASE LOADS

FIELD OF THE INVENTION

The invention is generally directed to power monitoring and particularly to accurately monitoring power usage on an unbalanced two phase circuit that includes a single phase load.

BACKGROUND OF THE INVENTION

With the present interest in monitoring power usage of individual circuits in a residence or business in order to insure that electric power is being used in the most economic manner some circuits have proven to be more difficult in obtaining accurate power measurements than others. Most circuits are either single phase or balanced two phase, both of which are easily monitored by using one current transformer (CT) to measure current through the circuit, which can be used to determine the quantity of power consumed by loads connected to the circuit. In a single phase circuit of FIG. 1 generally indicated by reference numeral 10, the CT is placed on the conductor L1 providing power to the single phase load 14. The measured current $I_1$ is multiplied by the measured voltage $V_{L1-N}$ to determine the total power used by the single phase load.

$$P = I_1 \times V_{L1-N}$$

In a balanced two phase circuit of FIG. 2, generally represented by reference numeral 18, the CT can be placed on either of the conductor L1 or L2 providing power to the balanced two phase load 22 because the current $I_1$ in conductor $L_1$ is equal to the current $I_3$ in conductor $L_2$. Therefore, the current $I_1$ in $L_1$ multiplied by voltage $V_{L1-N}$ multiplied by 2 or the current $I_3$ in L2 multiplied by voltage $V_{L2-N}$ multiplied by 2 will produce the total power used by the balanced two phase load 22.

$$P = I_1 \times V_{L1-N} \times 2 \text{ or } P = I_3 \times V_{L2-N} \times 2$$

However, some two phase circuits are not balanced, such as the circuit generally indicated by reference numeral 26 in FIG. 3. The unbalanced circuit 26 has both a two phase load 22 and a single phase load 14. These unbalanced circuits 26 are generally found in devices such as an electric clothes dryer, which is the most common example of this type of two phase circuit in residential applications. With respect to the clothes dryer, the single phase load 14 (generally a motor, control electronics and/or a timer) will always be ON when the two phase load 22 (generally a heater) is ON, and can be ON when the two phase load 22 is OFF. Therefore, using a single CT on either of the conductors L1 or L2 to measure current in unbalanced two phase circuit 26, and using the balanced load calculation to determine total current through the circuit, as described above, cannot result in an accurate determination of total consumed power for the unbalanced two phase circuit 26. If the single CT is installed on the conductor L1, which provides power to both the two phase load 22 and the single phase load 14, the determined power consumption for the circuit will be too high. This is because the CT will measure current $I_1$, which is the current passing through the two phase load 22 and current I2, which is the current passing through the single phase load 14.

$$P < I_1 \times V_{L1-N} \times 2$$

If a single CT is installed on conductor L2 the determined power consumption for the circuit will be too low because the CT will only measure current I3, which is only the current passing through the two phase load 22.

$$P > I_3 \times V_{L2-N} \times 2$$

Therefore, installing CTs on both conductors L1 and L2, and adding the power calculated from the current measured by each of the CTs is the obvious solution for accurate power monitoring in unbalanced two phase circuit 26.

$$P = (I_1 \times V_{L1-N}) + (I_3 \times V_{L2-N})$$

However, there may not be sufficient room in the load center for using two CTs on one circuit or it could mean that the number of circuits monitored must be reduced. Therefore, a means to accurately monitor power usage on unbalanced two phase circuits such as circuit 26 having both a single phase load 14 and a two phase load 22 with one CT is desirable.

SUMMARY OF THE INVENTION

The present invention provides a method that accurately monitors power usage in an unbalanced two phase circuit having a two phase load and a single phase load. The method includes an algorithm which controls an initial learning phase that determines if the current transformer (CT) has been placed on the conductor L1 or L2 providing power to both the two phase load and the single phase load, and indicating the results of that determination to a user/installer. After the learning phase has confirmed that the CT is on the correct conductor the algorithm learns the characteristics of the single phase load and in some instances the characteristics of the two phase load, and stores the characteristics in a memory for future use during a run phase algorithm. The run phase algorithm determines how much current is drawn by the single phase load and the two phase load and the amount of time each load has been ON. The run phase algorithm then uses this information to accurately determine the total power consumed by the combined loads. The total power consumed by the two phase circuit is then stored in the memory and/or reported to one or more of a local monitoring device, a remote monitoring device a user or a third party monitoring site for further evaluation.

A method for accurately determining the power consumed by an unbalanced two phase circuit having a two phase load and a single phase load using a single current transformer (CT), the method comprising:

a learning phase comprising:
  installing the CT on a conductor of the unbalanced two phase circuit;
  determining, by a processor, if the CT is on the conductor of the unbalanced two phase circuit providing power to the single phase load;
  initiating, by the processor, a correction of the CT placement if the conductor on which the CT was installed does not provide power to the single phase load; and
  learning, by the processor, characteristics of the single phase load and storing the learned characteristics in a memory associated with the processor; and a run phase comprising:
  monitoring, by the processor, a total current drawn during each operation of the unbalanced two phase circuit by the single phase load and the two phase load;
  determining, by the processor, the power consumed by the unbalanced two phase circuit base on the current drawn by the single and two phase loads;

processing, by the processor, the learned characteristic of the single phase load and the determined power consumed by the unbalanced two phase circuit;

determining, by the processor, after each operation of the unbalanced two phase circuit, an accurate power consumption of the single and two phase loads based on the processing; and reporting the accurate power consumption of the single and two phase loads to one of a home automation and control system, a building monitoring system, or a remote monitoring system.

DETAILED DESCRIPTION OF THE EMBODIMENTS

Figure 1:
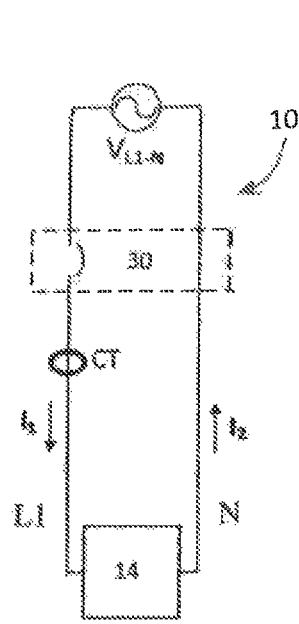
FIG. 1 illustrates current monitoring in a simple single phase circuit.
Figure 2:
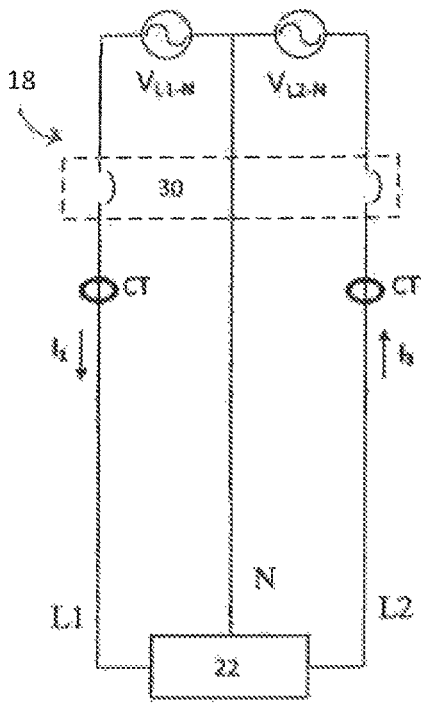
FIG. 2 illustrates current monitoring in a balanced two phase circuit.
Figure 3:
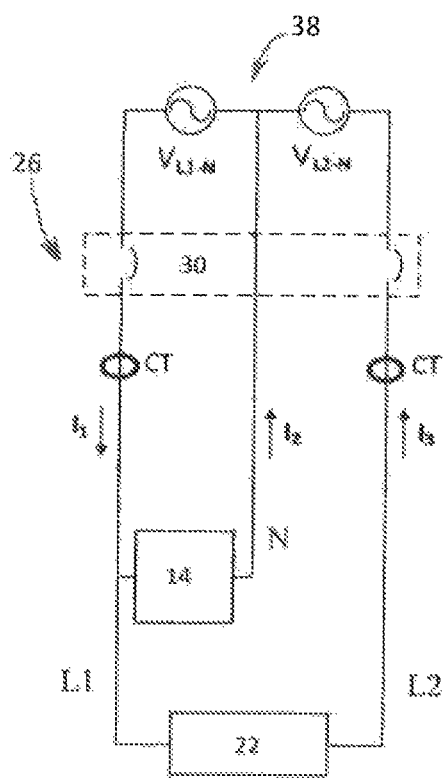
FIG. 3 illustrates possible current monitoring methods in an unbalanced two phase circuit having both a single phase load and a two phase.

Referring again to FIG. 3, the unbalanced two phase circuit 26 to be monitored will generally include a two pole switching device 30, such as a circuit breaker, located in an electrical distribution device 34, such as a service entrance panel, load center or panelboard. The line side of the switching device 30 is connected to a power source 38 generally provided by a public utility and capable of providing at least two phase power. Connected to the load side of the switching device 30 are two conductors L1 and L2. The conductors L1 and L2 are connected to the two phase load 22. Also connected to conductor L1 in FIG. 3, is a single phase load 14, which is connected to a neutral conductor N that is connected a neutral bus in the electrical distribution device 34 for returning current to the power source 38.

Figure 5:
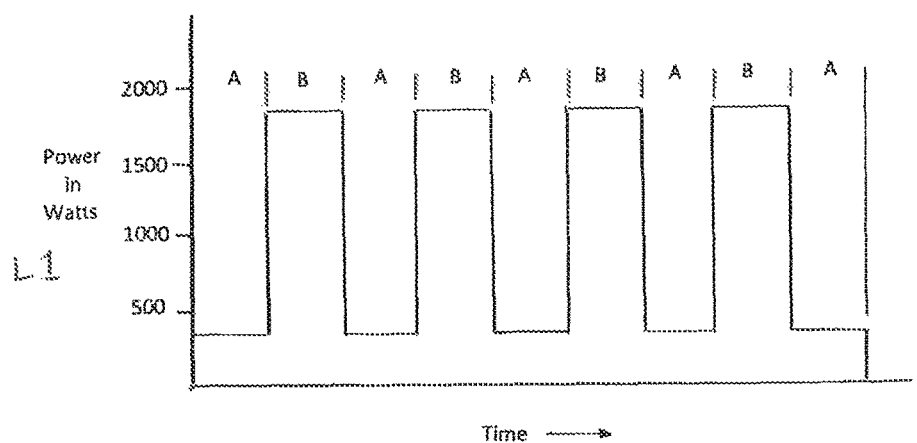
FIG. 5 is a graphical illustration of power vs time in $L_1$ of the unbalanced two phase circuit of FIG. 3.
Figure 6:
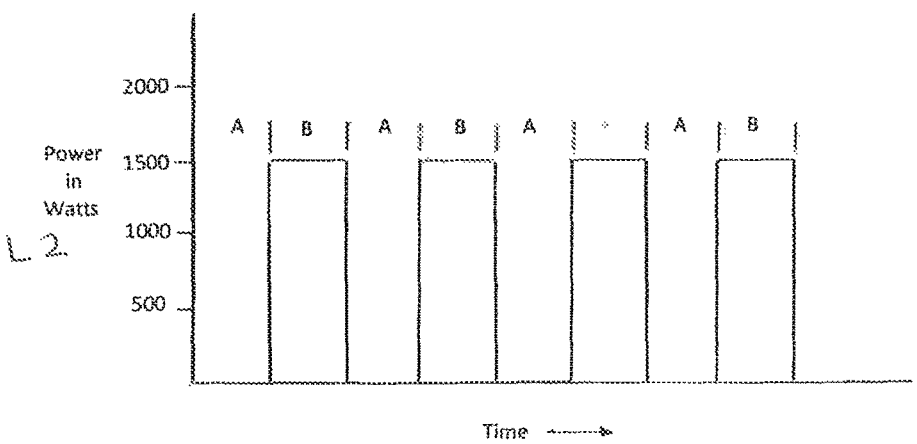
FIG. 6 is a graphical illustration of power vs time of the two phase load in $L_2$ of the unbalanced two phase circuit of FIG. 3.

FIG. 5 is a graphical illustration of power vs time in $L_1$ of the unbalanced two phase circuit 26. The single phase load 14, having a low current draw, generally within a range of 1 to 5 amps and generally consuming power in a range of 1 to 500 watts, is shown at the bottom of the graph. The two phase load 22, operating at some duty cycle represented by time periods A and B, and having a higher current draw, generally more than 5 amps and generally consuming between 1 and 5 kilowatts, is illustrated by columns in the upper part of the graph. During the A time periods only the single phase load 14 is ON, and during the B time periods both the single phase load 14 and the two phase load 22 are ON. FIG. 6 is a graphical illustration of power vs time for $L_2$ of the two phase load 22 portion only of the unbalanced two phase circuit 26.

Figure 4:
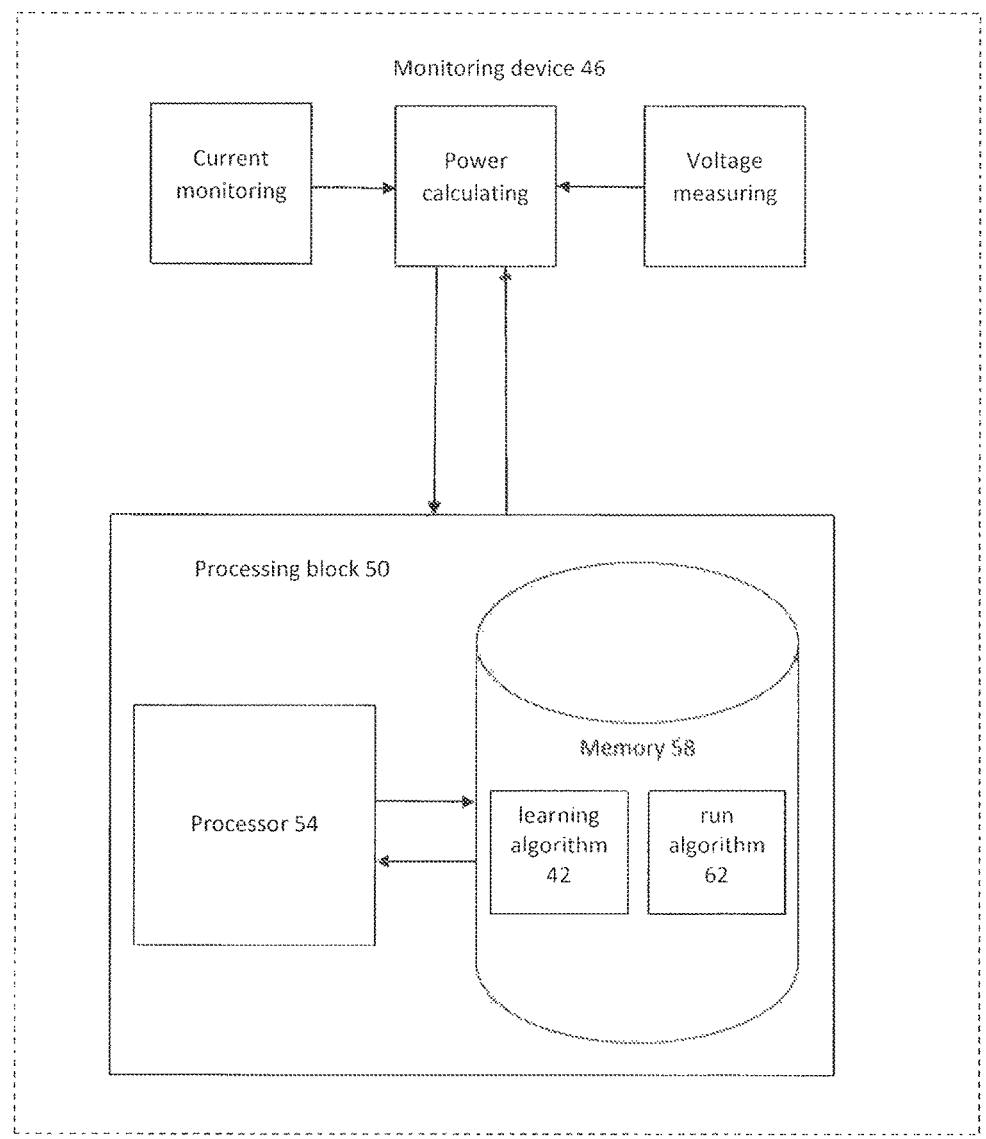
FIG. 4 illustrates the two phase circuit monitoring device.
Figure 7:
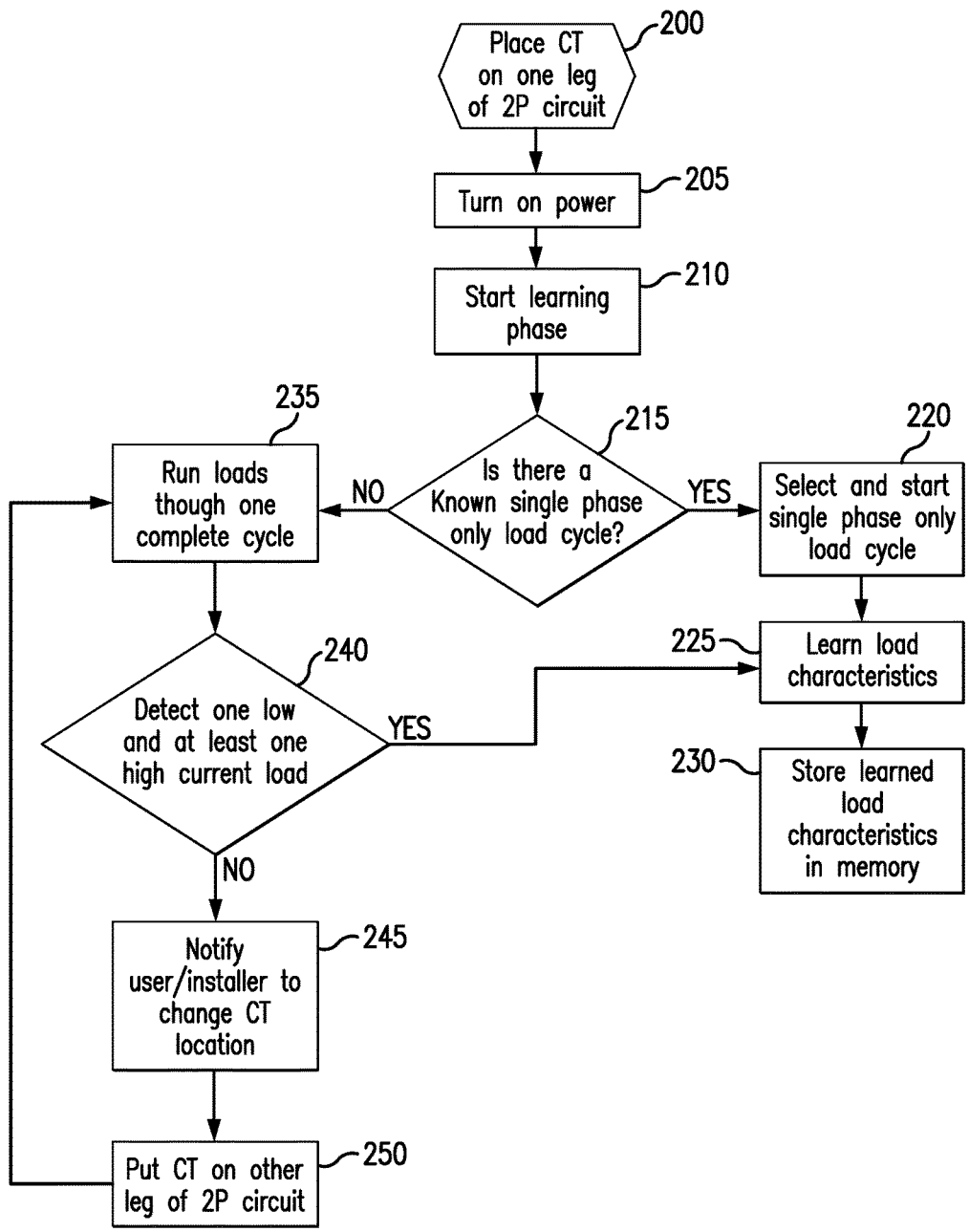
FIG. 7 is a flow chart of the initial learning phase of the power monitoring method of the present invention.

Before the power monitoring method of the present invention can become operational an initial learning phase 42 as illustrated in the flow chart of FIG. 7 must be initiated by the user/installer of the loads 14 and 22 connected to the two phase circuit 26. As indicated in the flow chart of FIG. 7, the initial learning phase 42 begins at step 200 by installing a CT on one of the conductors L1 or L2 of the unbalanced two phase circuit 26. The output of the CT is received by a circuit monitoring device 46, which is also monitoring the associated voltage ($V_{L1-N}$ or $V_{L2-N}$) of the conductor $L_1$ or $L_2$ on which the CT is installed, and using those measurements to continually calculate power consumed in the monitored conductor $L_1$ or $L_2$. These power measurements are sent to a processing block generally indicated by reference numeral 50 in FIG. 4. The processing block 50 can be located inside the circuit monitoring device 46, the electrical distribution center 34, in a remote server, or hosted inside a cloud application. The processing block 50 includes a processor 54, a non-transitory memory 58 for storing algorithms for the initial learning phase 42 and a running phase 62, and the results of the initial learning phase 42 and the running phase 62. The algorithms 42 and 62 are configured to be implemented by the processor 54.

At step 205 power to the monitored unbalanced two phase circuit 26 is turned on at switching device 30 by the user/installer.

At step 210, the learning phase algorithm 42 is initiated by the user/installer.

At step 215, the user/installer will determine if there is a complete or partial cycle in which the single phase load 14 is known to be the only load ON (e.g. a cool down cycle or air dry cycle in a dryer where the drum is rotating but the heater is OFF). If there is a known single phase load only cycle the processor 54 will proceed to step 220, if not the processor 54 will proceed to step 235.

At step 220 the user/installer will select the single phase load only cycle and start that cycle.

At step 225 a characteristic K of the single phase load 14 is learned and stored in memory 58 at step 230. The characteristic K being learned is the power signature of the single phase load 14 connected to the conductor on which the CT is installed. The power signature is an average operating power ($P_{2ave}$) drawn by the single phase load only cycle.

Alternatively, if at step 215 there were no known operating cycles in which the single phase load 14 is the only load ON, the processor 54 will proceed to step 235. At step 235 the user/installer will select and start a cycle of the unbalanced two phase circuit 26 in which both the single phase load 14 and the two phase load 22 are ON.

At step 240, if the processing block 46 determines that there is a low power single phase load 14 connected to the conductor L1 or L2 on which the CT is attached, the processor 54 will proceed to step 225 where the characteristic K of the single phase load 14 and the characteristics of the two phase load 22 are learned and then proceed to step 230 where the learned characteristics are stored in memory 58.

If, at step 240, the processing block 46 determines that there was no low power drawing single phase load 14 connected to the conductor L1 or L2 on which the CT is attached the monitoring device 46 will notify the user/installer at step 245 by sending a message to at least one of a local display, a home automation and control system, a building management system, a smart device, a human machine interface (HMI) or similar device, indicating that no low power drawing single phase load 14 was detected.

At step 250, upon receiving the message from step 245 indicating that no low power drawing single phase load 14 was detected, the user/installer will remove the CT from the conductor L1 or L2 on which it was installed and install it on the other conductor L1 or L2. The processor 54 will return to step 235.

At step 235, the user/installer will again select and start a cycle of the unbalanced two phase circuit 26 in which both the single phase load 14 and the two phase load 22 are ON At steps 240 the monitoring device 46 will confirm that a single phase load 14 is connected to conductor L1 or L2 on which the CT is now attached, and the processor 54 will proceed to step 225 where the characteristics of the loads 14 and 22 are learned and then to step 230 where the learned characteristics are stored in memory 58.

After the learning phase algorithm 42 is completed and the load characteristics have been stored in memory 58 the learning phase algorithm 42 should not need to be run again unless there has been an event that would change the electrical wiring from the switching device 30 to the unbalanced two phase circuit 26 or unless one or both of the single phase load 14 and two phase load 22 have been replaced. The load characteristics stored in memory 58 will be used in the run algorithm 62 to determine an accurate measurement of the total power consumed by the unbalanced two phase circuit 26.

Figure 8:
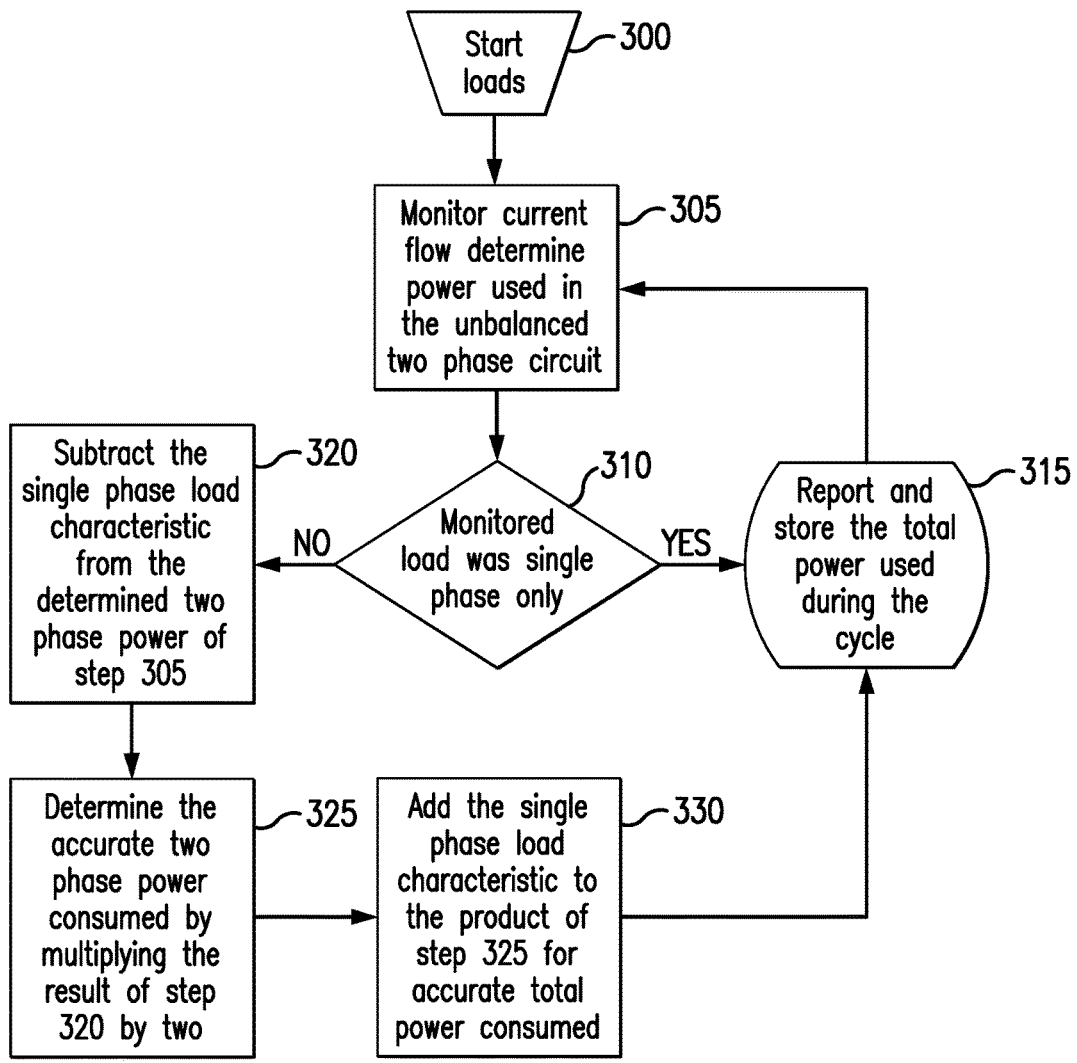
FIG. 8 is a flow chart of the running phase of the power monitoring method of the present invention.

Referring now to FIG. 8, the run algorithm 62 will be described with respect to the unbalanced circuit 26 of FIG. 3 where a single CT is place on conductor $L_1$. The run algorithm 62 is initiated at step 300 by starting one or both of the single phase load 14 and/or two phase load 22 on the unbalanced two phase circuit 26.

At step 305, the circuit monitoring device 46 begins to monitor and record current $I_1$ sensed by the CT and calculates the power being consumed.

At step 310, the calculated power is compared to the learned single phase load characteristic K from one of steps 225 or 240. If the calculated power is within the range expected (1 to 500 watts) for the single phase load characteristic K, the algorithm moves through step 310 and the calculated power is reported in step 315 without modification.

$$P_{1PL+}P_{2PL}=I_1 \times V_{L1-N}$$

If, at step 310, the calculated power consumed is greater than the expected ranged for learned single phase load characteristic K, the algorithm assumes that the two phase load is also present and moves to step 320.

At step 320, the processor 54 subtracts the previously stored single phase load 14 characteristic K determined by the learning phase algorithm 42, from the calculated power consumed by the unbalanced two phase circuit 26 in step 305 to obtain half of the power consumed by the two phase load 22.

$$P_{1/2\ 2PL}=(I_1 \times V_{L1-N})-K$$

At step 325, the processor 54 will multiply the remainder resulting from the subtraction in step 320 by two to provide an accurate determination of the total power consumed by the two phase load 22.

$$P_{2PL}=P_{1/2\ 2PL} \times 2$$

At step 330, the processor 54 will accurately determine the total power consumed by the unbalanced two phase circuit 26 by adding the single phase load 14 characteristic K determined by the learning algorithm 62 to the determined total power consumed by unbalanced two phase load 26 and move to step 315.

$$P_{TOTAL}=P_{2PL}+K$$

In step 315, the processing block 50 stores the accurately determined total power consumed by the unbalanced two phase circuit 26 in memory 58 and reports the total power consumed to a home automation and control system, a building monitoring system or other similar monitoring system.

Figure 9:
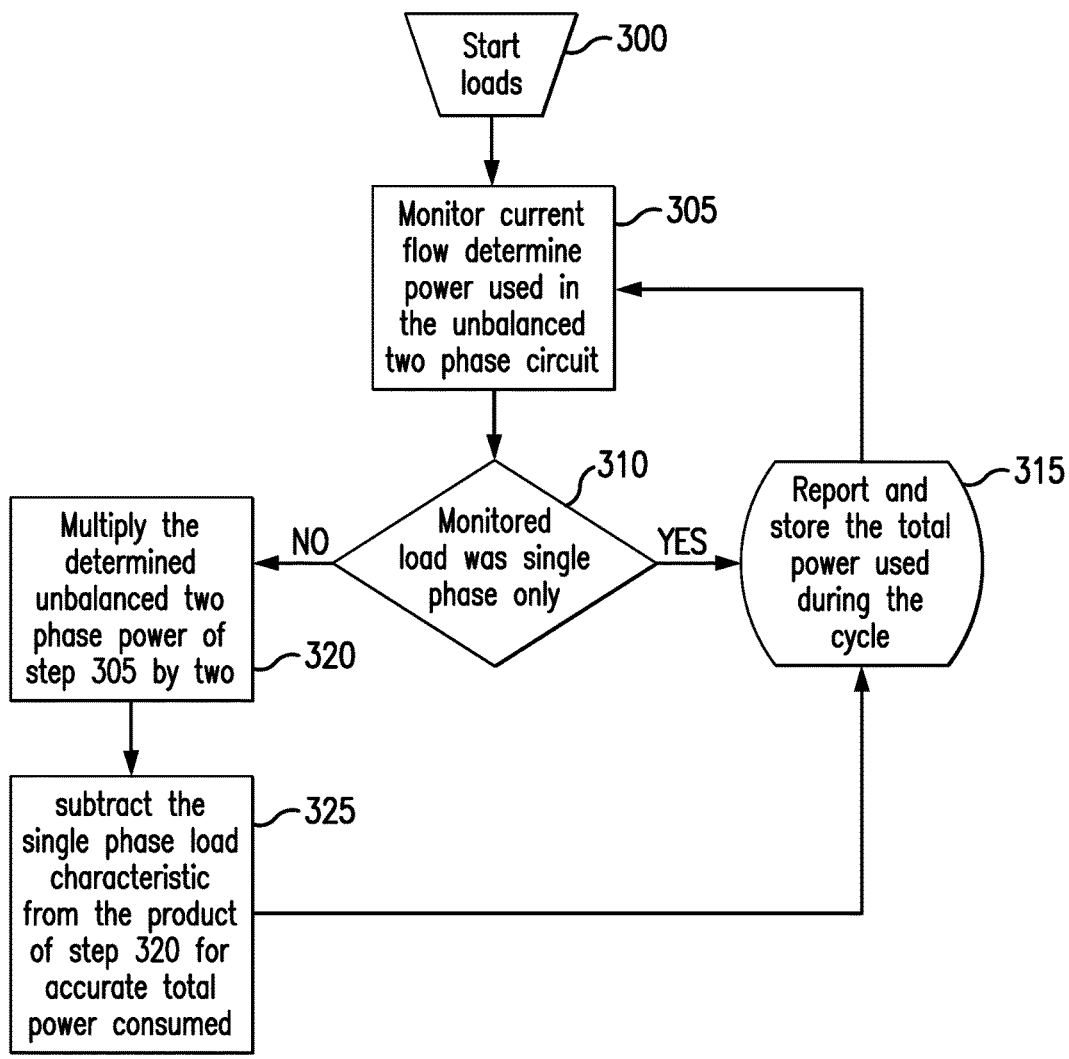
FIG. 9 is a flow chart for an alternate running phase for the power monitoring method of the present invention.

An alternate method of accurately determining the power consumed by the unbalanced two phase circuit 26 is described in the flow chart of FIG. 9. The alternate method follows the steps 300-315 as described above. However, in step 320 the calculated power from step 305 is multiplied by two and in step 325 the single phase load characteristic K is subtracted from the product of step 320. The remainder power resulting from step 325 is the accurate power consumed by the unbalanced two phase circuit 26 and is passed on to step 315 for reporting and storing.

It is to be understood that a system of present invention can be used in other situations where unbalanced electrical loads need to be accurately monitored, and with slight modifications can be used to accurately monitor power consumed by several loads on multiphase electrical circuits.

I claim:

1. A method for accurately determining the power consumed by an unbalanced two phase circuit having a two phase load and a single phase load using a single current transformer (CT), the method comprising:
   a learning phase comprising:
   determining, by a processor, if a CT installed on a conductor of the unbalanced two phase circuit is installed on the conductor of the unbalanced two phase circuit providing power to the single phase load, wherein determining if the CT is installed on the conductor providing power to the single phase load comprises operation of both the single phase load and the two phase load and determining, by the processor, that a current or a power consumed is within a range expected for the combined single phase load and the two phase load is detected in the conductor for a first period of time and that a current or a power consumed is within a range expected for the single phase load only is detected in the conductor for a second period of time;
   initiating, by the processor, a correction of the CT placement if the conductor on which the CT was installed does not provide power to the single phase load; and
   learning, by the processor, characteristics of the single phase load and storing the learned characteristics in a memory associated with the processor; and
   a run phase comprising:
   monitoring, by the processor, a total current drawn during each operation of the unbalanced two phase circuit by the single phase load and the two phase load;
   determining, by the processor, the power consumed by the unbalanced two phase circuit based on the monitored current drawn by the single and two phase loads;
   determining, by the processor, after each operation of the unbalanced two phase circuit, an accurate power consumption of the single and two phase loads based on the learned characteristic of the single phase load and the determined power consumed by the unbalanced two phase circuit; and
   reporting the accurate power consumption of the single and two phase loads to one of a home automation and control system, a building monitoring system, or a remote monitoring system.

2. The method of claim 1, wherein determining if the CT is on the conductor providing power to the single phase load, includes selecting an operation that requires only the single phase load, initiating that operation and determining, by the processor, that one of a current flowing in or a power consumed by the monitored conductor is within a range expected for the single phase load.

3. The method of claim 1, wherein initiating the correction of the CT placement includes notifying a user/installer that the processor did not detect a single phase load connected to the conductor on which the CT was initially installed and that the user/installer should remove the CT from the conductor on which it was initially installed and install the CT on the other conductor of the unbalanced two phase circuit.

4. The method of claim 1, wherein learning the characteristic of the single phase load include monitoring, by the processor, a current drawn by the single phase load, determining an average current drawn and an average power consumed by the single phase load and storing the determined average current drawn and power consumed in the memory.

5. The method of claim 1, wherein determining, by the processor, the accurate power consumption of the single and two phase loads includes subtracting the learned characteristic of the single phase load from the determined power consumed by both the single and two phase loads, multiplying a difference resulting from the subtraction by two and adding the learned characteristic of the single phase load to a product resulting from the multiplying, a sum resulting from the adding being the accurate determination of the power consumed by the unbalanced two phase circuit.

6. The method of claim 5, wherein the learned characteristic of the single phase load is the determined average power consumed by the single phase load.

7. The method of claim 1, wherein determining, by the processor, the accurate power consumption of the single and two phase loads includes multiplying the determined power consumed by the unbalanced two phase circuit and subtracting the learned characteristic of the single phase load from a product resulting from the multiplying, a difference resulting from the subtraction being the accurate determination of the power consumed by the unbalanced two phase circuit.

8. The method of claim 7, wherein the learned characteristic of the single phase load is the determined average power consumed by the single phase load.

9. The method of claim 1, wherein reporting the accurate power consumption includes sending a message containing the determined accurate power consumption of the unbalanced two phase circuit by any appropriate means to the home automation and control system, the building monitoring system, or the remote monitoring system.

10. The method of claim 1, wherein operations performed by the processor are controlled by at least one algorithm having a number of step configured to be processed by the processor, the algorithm being stored in the memory.

11. The method of claim 1 wherein the learning phase and run phase are controlled by at least one algorithm configured to be implemented by the processor, which can be an actual device or a virtual device, capable of performing the steps defined in the algorithm, the processor, algorithm, and memory in which the algorithm and its implemented results are stored can be located at a device in which the loads reside, an electrical distribution device or at a remote location such as a home automation panel, remote monitoring service or in a cloud based computing system.

12. A method for accurately determining the power consumed by an unbalanced two phase circuit having a two phase load and a single phase load using a single current transformer (CT), the method comprising:
an initial learning phase wherein a processor determines whether the CT monitoring a current flowing in the unbalanced two phase circuit is on a conductor providing power to both the single phase load and the two phase load, wherein the learning phase comprises,
determining, by the processor, if a CT installed on a conductor of the unbalanced two phase circuit is installed on the conductor of the unbalanced two phase circuit providing power to the single phase load;
initiating, by the processor, a correction of the CT placement if the conductor on which the CT was installed does not provide power to the single phase load, wherein initiating a correction of the CT placement comprises notifying a user/installer that the processor did not detect a single phase load connected to the conductor on which the CT was initially installed and that the user/installer should remove the CT from the conductor on which it was initially installed and install the CT on the other conductor of the unbalanced two phase circuit; and
learning, by the processor, characteristics of the single phase load and storing the learned characteristics in a memory associated with the processor; and
a run phase wherein the processor determines, at each operation of the unbalanced two phase circuit, an accurate power consumption of the combined single phase and two phase loads by monitoring the current flowing through the unbalanced two phase circuit with the single CT.

13. The method of claim 12, wherein operations performed by the processor are controlled by at least one algorithm having a number of step configured to be implemented by the processor, the processor, algorithm and a memory associated with the processor can be located in a device in which the loads reside or at a remote location such as an electrical distribution device, a home automation panel, a remote monitoring service or in a cloud based computing system.

14. The method of claim 12, wherein determining if the CT is on the conductor providing power to the single phase load, includes selecting an operation that requires only the single phase load, initiating that operation and determining, by the processor, that a current in a range expected for the single phase load is flowing in the conductor.

15. The method of claim 12, wherein determining if the CT is on the conductor providing power to the single phase load, includes operating both the single phase load and the two phase load and determining, by the processor, that a current in a range expected for the combined single phase load and the two phase load is flowing in the conductor for a first period of time and that a current in a range expected for the single phase load only is flowing in the conductor for a second period of time.

16. The method of claim 12, wherein learning the characteristics of the single phase load includes monitoring, by the processor, a current drawn by the single phase load, determining an average current drawn and an average power consumed by the single phase load and storing the determined average current drawn and average power consumed in the memory.

17. The method of claim 12, wherein the run phase comprises:

monitoring, by the processor, during each operation of the unbalanced two phase circuit, a total current drawn by the single phase and two phase loads during the operation;

determining, by the processor, a power consumed by the unbalanced two phase circuit based on the monitored current drawn by the single and two phase loads;

determining, by the processor, after each operation of the unbalanced two phase circuit, an accurate power consumption of the unbalanced two phase circuit based on the learned characteristic of the single phase load and the determined power consumed by the unbalanced two phase circuit during the operation; and reporting the accurate power consumption of the unbalanced two phase circuit determined by the processor to at least one of a home automation and control system, a building monitoring system, or a remote monitoring system.

18. The method of claim 17, wherein determining, by the processor, the accurate power consumption of the single and two phase loads includes subtracting the learned characteristic of the single phase load from the determined power consumed by the single and two phase loads, multiplying a difference resulting from the subtraction by two and adding the learned characteristic of the single phase load to a product resulting from the multiplying, the a sum resulting from the adding being the accurate determination of the power consumed by the unbalanced two phase circuit.

19. The method of claim 17, wherein the learned characteristic of the single phase load is a determined average power consumed by the single phase load.

20. The method of claim 17, wherein determining, by the processor, the accurate power consumption of the single and two phase loads includes multiplying the determined power consumed by the unbalanced two phase load by two and subtracting the learned characteristic of the single phase load from a product resulting from the multiplying, a difference resulting from the subtraction being the accurate determination of the power consumed by the unbalanced two phase circuit.

21. The method of claim 20, wherein the learned characteristic of the single phase load is the determined average power consumed by the single phase load.

22. The method of claim 17, wherein reporting the accurate power consumption includes sending a message containing the determined accurate power consumption of the unbalanced two phase circuit by any appropriate means to at least one of the home automation and control system, the building monitoring system, or the remote monitoring system.

23. A method for accurately determining the power consumed by an unbalanced two phase circuit having a two phase load and a single phase load using a single current transformer (CT), the method comprising:
a learning phase comprising:
determining, by a processor, if a CT installed on a conductor of the unbalanced two phase circuit is installed on the conductor of the unbalanced two phase circuit providing power to the single phase load;
initiating, by the processor, a correction of the CT placement if the conductor on which the CT was installed does not provide power to the single phase load; and
learning, by the processor, characteristics of the single phase load and storing the learned characteristics in a memory associated with the processor; and
a run phase comprising:
monitoring, by the processor, a total current drawn during each operation of the unbalanced two phase circuit by the single phase load and the two phase load;
determining, by the processor, the power consumed by the unbalanced two phase circuit based on the monitored current drawn by the single and two phase loads;
determining, by the processor, after each operation of the unbalanced two phase circuit, an accurate power consumption of the single and two phase loads based on the learned characteristic of the single phase load and the determined power consumed by the unbalanced two phase circuit; and
reporting the accurate power consumption of the single and two phase loads to one of a home automation and control system, a building monitoring system, or a remote monitoring system,
wherein initiating the correction of the CT placement comprises notifying a user/installer that the processor did not detect a single phase load connected to the conductor on which the CT was initially installed and that the user/installer should remove the CT from the conductor on which it was initially installed and install the CT on the other conductor of the unbalanced two phase circuit.

24. A method for accurately determining the power consumed by an unbalanced two phase circuit having a two phase load and a single phase load using a single current transformer (CT), the method comprising:
an initial learning phase wherein a processor determines whether the CT monitoring a current flowing in the unbalanced two phase circuit is on a conductor providing power to both the single phase load and the two phase load, wherein the learning phase comprises,
determining, by the processor, if a CT installed on a conductor of the unbalanced two phase circuit is installed on the conductor of the unbalanced two phase circuit providing power to the single phase load;
initiating, by the processor, a correction of the CT placement if the conductor on which the CT was installed does not provide power to the single phase load; and
learning, by the processor, characteristics of the single phase load and storing the learned characteristics in a memory associated with the processor; and
a run phase wherein the processor determines, at each operation of the unbalanced two phase circuit, an accurate power consumption of the combined single phase and two phase loads by monitoring the current flowing through the unbalanced two phase circuit with the single CT,
wherein determining if the CT is installed on the conductor providing power to the single phase load, comprises operation of both the single phase load and the two phase load and determining, by the processor, that a current in a range expected for the combined single phase load and the two phase load is flowing in the conductor for a first period of time and that a current in a range expected for the single phase load only is flowing in the conductor for a second period of time.

* * * * *